US006925431B1

(12) United States Patent
Papaefstathiou

(10) Patent No.: US 6,925,431 B1
(45) Date of Patent: Aug. 2, 2005

(54) METHOD AND SYSTEM FOR PREDICTING COMMUNICATION DELAYS OF DETAILED APPLICATION WORKLOADS

(75) Inventor: Efstathios Papaefstathiou, Cambridge (GB)

(73) Assignee: Microsoft Corporation, Redmond, WA (US)

( * ) Notice: Subject to any disclaimer, the term of this patent is extended or adjusted under 35 U.S.C. 154(b) by 885 days.

(21) Appl. No.: 09/632,522

(22) Filed: Aug. 4, 2000

Related U.S. Application Data

(60) Provisional application No. 60/209,759, filed on Jun. 6, 2000.

(51) Int. Cl.$^7$ ............................ G06F 17/50; G06F 9/44; G06F 9/45; G06F 13/10; G06G 7/62

(52) U.S. Cl. ............................ 703/17; 703/21; 703/22; 718/100; 718/102; 709/223

(58) Field of Search .............................. 703/22, 17, 21; 718/100, 102; 709/223

(56) References Cited

U.S. PATENT DOCUMENTS

| | | | | |
|---|---|---|---|---|
| 6,106,575 | A | * | 8/2000 | Hardwick .................. 718/105 |
| 6,292,822 | B1 | * | 9/2001 | Hardwick .................. 718/105 |
| 6,667,957 | B1 | * | 12/2003 | Corson et al. .............. 370/238 |

OTHER PUBLICATIONS

Anderson, A. "The Routing Table." http://www.tldp.org/LDP/nag/node31.html. Last updated: Mar. 7, 1996. Printed on Mar. 8, 2004.*

Kerbyson et al. "Is Predictive Tracing Too Late for HPC Users?" High Performance Computing, Plenum Press, 1998.*

Papaefstathiou et al. "A Common Workload interface for the Performance Predicition of High Performance Systems." Jun. 1998.*

(Continued)

*Primary Examiner*—Kevin J. Teska
*Assistant Examiner*—Ayal Sharon
(74) *Attorney, Agent, or Firm*—Leydig Voit & Mayer, LTD

(57) ABSTRACT

A method and system for generating a communication model are disclosed. The communication model is used to provide performance information on the use of communication networks by application code. The expected utilization of resources is important to when high performance is to be achieved in both cluster computing environments and information power GRIDs.

The disclosed method and system is designed to generate a model of an underlying network topology using detailed workload information, which encapsulates the expected computation/communication requirements of an application. Such workload information may be obtained from a number of different sources. Furthermore, the disclosed method provides detailed information of the expected use of a network system unlike traditional communication models that rely on statistical information and provide general performance information.

The disclosed method is a hybrid model containing statistical model information as well as steps for simulating the main stages that change the state of the communication network traffic. As such, the evaluation time is orders of magnitude quicker than traditional methods, while providing predictions, which are of reasonable accuracy. The characteristics of different networks can be easily incorporated into the model, and thus the model can be used in a variety of situations. The output of the model is the expected delay of a set of communications, which can be further, expanded into a suitable trace format and visualized for further investigation. In evaluation tests, the disclosed method and system provides predictions which are more accurate than simple regression models while requiring seconds of CPU processing time.

31 Claims, 10 Drawing Sheets

OTHER PUBLICATIONS

Papaefstathiou et al. "AN Introduction to the Layered Characterisation for High Performance Systems" Dec. 1997.*

Kerbyson et al. "Application Execution Steering Using On-The-Fly Performace Prediction". High Performance Computing and Networking 98. Apr. 1998.*

Kerbyson et al. "PACE: A Toolset to Investigate and Predict Performance in Parallel Systems." European Parallel Tools Meeting, ONERA. Oct. 1996.*

"DBLP: Efstathios Papaefstathiou" http://www.informatik.uni-trier.de. Printed Jan. 10, 2005.*

Darren J. Kerbyson, John S. Harper, Efstathios Papaefstathiou, Daniel V. Wilcox, Graham R. Nudd: "Use of Performance Technology for the Management of Distributed Systems." Euro–Par 2000: 149–159.*

A. M. Alkindi, Darren J. Kerbyson, Efstathios Papaestathiou, Graham R. Nudd: "Run–Time Optimization Using Dynamic Performance Prediction."HPCN Europe 2000: 280–289.*

Efstathios Papaefstathiou: "Design of a performance technology infrastructure to support the construction of responsive software." Workshop on Software and Performance 2000: 96–104.*

Cao, Junwei et al. "Performance Modeling of Parallel and Distributed Computing Using PACE." IPCCC '00. Feb. 22, 2000. pp. 485–492.*

Harrison, P. G., "Performance Modelling of Communication Networks and Computer Architectures", (*Addison–Wesley Publishing Company*) pp. 1–472 (1993).

Bhuyan, Laxmi, N. et al., "Performance of Multiprocessor Interocnnection Networks", (Feb. 1989) pp. 25–37.

Bajaj, Sandeep, et al., "Improving Simulation for Network Research", University of *Southern California Science Department Technical Report* 99–702B, Mar. 1999 (revised Sep. 1999), pp. 1–11.

Nelson, Randolph, et al., "Performance Analysis of Parallel Processing Systems", *IEEE Transactions on Software Engineering*, 14(4):532–(Apr. 1988).

Jain, Raj, "The Art of Computer Systems Performance Analysis" Techniques for Experimental Design, Measurement, Simulations and Modeling, (*John Wiley & Sons, Inc.*) pp. 1–685, (1991).

Fahringer, Thomas, "Estimating and Optimizing Performance to Parallel Program", *IEEE*, 28(11):47–56, (1995).

Cao, J. et al., "Performance Modelling of Parallel and Distributed Computing Using PACE", *IEEE International Performance Computing and Communication Conference* (*IPCCC–200*), Phoenix, USA, pp 1–8, (Feb. 2000).

Parashar, Manish, et al., "Compile–Time Performance Prediciton of HPF/Fortran 90D", *IEEE Parallel & Distributed Technology*, 4(1):57–73, (1996).

Smith, C.U., "Performance Engineering of Software systems", Addison–Wesley Publishing Company, pp. 1–570, (1990).

http.//www.perfeng.com, copy of home page of Internet Website.

* cited by examiner

FIG. 3

| Event Type | Arguments | Description |
|---|---|---|
| Processing | time | The processor remains idle for the specified time. |
| Blocking Send | source, target, length | Source processor sends a message of specified length to target processor. The source processor blocks until the event completes. |
| Blocking Receive | source, target, length | Target processor receives a message of specified length from source processor. The target processor blocks until the event completes. |
| Asynchronous Send | source, target, length | Source processor sends a message of specified length to the target processor. The source processor can immediately proceed to the next event. |
| Asynchronous Receive | source, target, length | Target processor receives a message of specified length from source processor. The target processor can immediately proceed to the next event. |
| Barrier | processor list | Processors in the list proceed with the next event after all have entered the synchronization event |

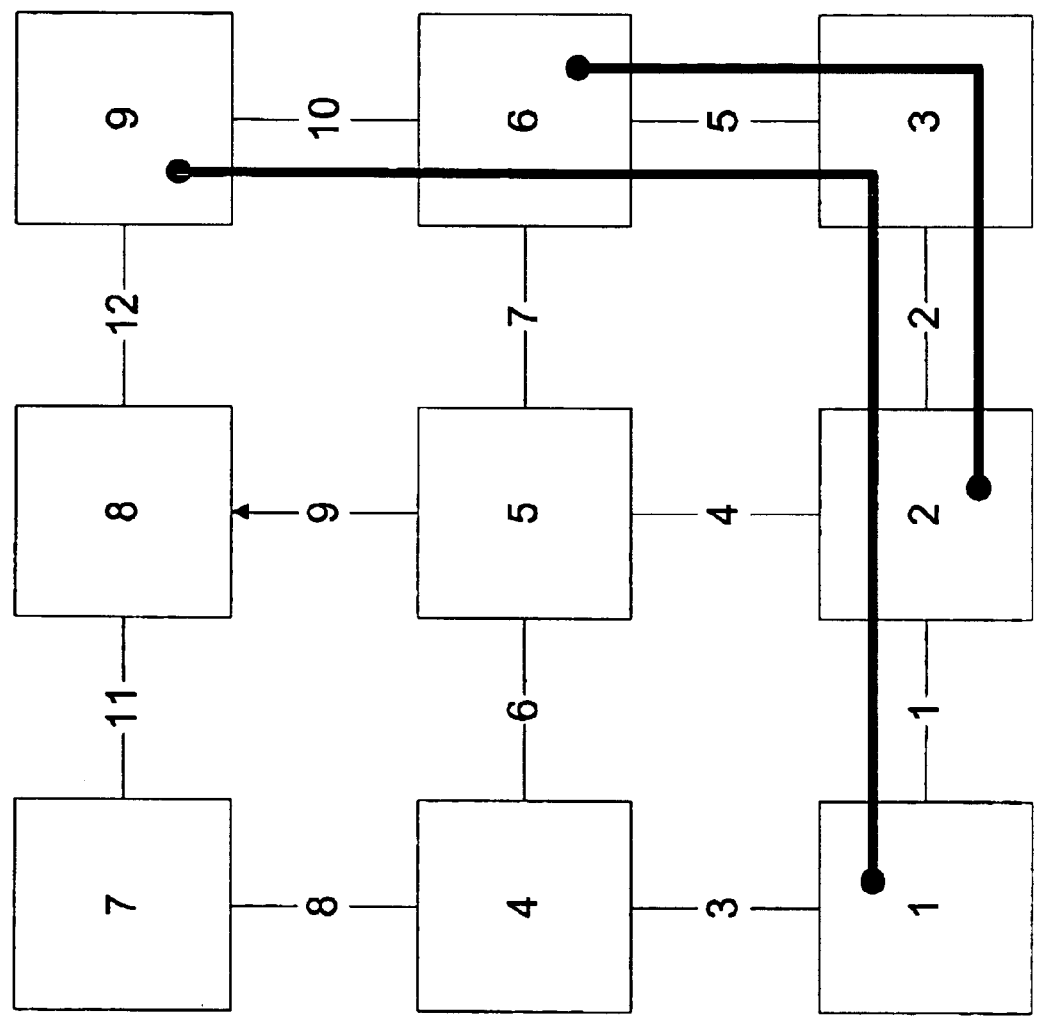

METHOD AND SYSTEM FOR PREDICTING COMMUNICATION DELAYS OF DETAILED APPLICATION WORKLOADS

This application claims the benefit of 60/209,759 filed on Jun. 6, 2000.

CROSS-REFERENCE TO RELATED APPLICATION

This application is related to co-pending application by Papaefstathiou, U.S. patent application Ser. No. 09/632,521, filed Aug. 4, 2000, entitled: "A PERFORMANCE TECHNOLOGY INFRASTRUCTURE FOR MODELING THE PERFORMANCE OF COMPUTER SYSTEMS," that is explicitly incorporated herein by reference in its entirety, including any appendices and references therein.

AREA OF THE INVENTION

The present invention generally relates to the area of methods and systems for predicting workload response of computer systems. More particularly, the present invention concerns methods and apparatuses for predicting communication delays in a system executing a detailed application workload.

BACKGROUND OF THE INVENTION

The performance/cost ratio of traditional high performance systems is continuously being improved by commodity workstations and PCs connected via high performance interconnection networks. Such interconnection networks facilitate distributing complex applications for execution in parallel by a number of relatively inexpensive workstations. Utilization of existing resources to minimize the cost of high performance computing has led to a number of unique network topologies. Such networks are employed, by way of example, in computational GRIDS. See, e.g., I. Foster, C. Kesselman, *The GRID Blueprint for a new Computing Infrastructure* (Morgan Kauffman, 1999). GRIDs are composed of distributed and often heterogeneous computing resources, and along with clustered environments, GRIDs have the potential to provide great performance benefits to distributed applications.

A challenge to programmers of systems incorporating new network topologies is the increased complexity arising in the programming of applications to enable the applications, when executed, to efficiently utilize and exploit the distributed computing capabilities of the underlying systems. Conventional static analysis of tasks and events that may occur simultaneously is not sufficient because executing an application in a distributed environment requires an awareness and consideration of the dynamic conditions of the system. Such dynamic conditions include availability of system components and the relative computational and/or network performance of the system components. In addition some applications respond, during execution, to external events such as system faults and changes in the load of networks and computers.

In the past, analytical performance evaluation tools focused upon enabling computer system architects to design the underlying interconnection hardware and operating system without reference to the particular applications executed on the designed systems. There is a need for tools that assist programmers to create applications that exploit the parallel processing capabilities of the distributed computing systems developed by such system architects, or alternatively to allow system architects to design distributed processing systems that exploit the capability of particular tasks within software applications or programming architectures.

Past efforts to estimate performance of a communication/computer network can be grouped into the following approaches: analytical, statistical, and simulation. Each of these known approaches suffers from one or more shortcomings that limit the practical value of programming tools embodying such approaches.

Analytical approaches, such as queuing and characterization network models have enabled system architects to understand general performance characteristics of particular network architectures. However, the analytical techniques are based upon approximated load conditions rather than actual load conditions generated by an executed application. Therefore, while useful for identifying bottlenecks in a system running generic workloads, they are relatively poor predictors of the actual delays experienced when an application, or group of applications, are executed.

Statistical regression approaches take a particular set of conditions, establish and measure a response characteristic, and then seek to project the measured results by interpolating/extrapolating the observed results to a particular configuration of interest. While relatively easy to create and fast to evaluate in comparison to other approached, the results are typically inaccurate when applied to a particular network configuration and load condition due to the absence of considering the dynamic characteristics of the system including contention between simultaneously active processes for network resources as well as background loading. Thus accurate predictions of performance of a system under a particular application load using statistical regression is generally limited to quiet networks—an improbable assumption in many of the situations of interest to today's programmers. In addition they do not provide any insight into the operation of the network.

Simulation involves a detailed analysis (at various levels of detail) of commands executed by the program under test in the selected network environment. Simulation has the potential to provide a high level of accuracy with respect to the identified approaches. However, simulation involves stepping through each instruction and noting the system response—often at a physical or routing level. Such evaluations are potentially very time consuming—even with the assistance of computers. Yet another shortcoming of simulation tools is the difficulties encountered when tailoring execution to a specific workload or network configuration.

SUMMARY OF THE INVENTION

The present invention embodies a new technique for modeling execution of distributed processes on networks, taking into consideration delays encountered during the transmission of messages between processing nodes over a connection network. The new technique incorporates aspects of several network modeling approaches including simulation, characterization, and statistical modeling. A communication delay is determined by performing calculations incorporating a combination of analytical and statistical models. State transition and workload trace processing are performed according to simulation-based techniques. The hybrid modeling process combines the advantage of high speed evaluation exhibited by analytical techniques with a high degree flexibility exhibited by simulation techniques. The structured organization of the new modeling technique facilitates, encourages, and enhances customization of workload trace formats, network configurations, and output traces.

In accordance with the present invention a system and method provide a delay model based upon a particular network topology executing a specified model load. Initially the system generates, for an active message, a routing structure based upon a network configuration and a source and destination of the active message. Thereafter, a contention structure is created by summing together routing structure elements for active message events. After creating the contention structure, an available bandwidth is calculated. The available bandwidth represents a portion of a total bandwidth available for use by the message at a path between network nodes utilized by the active message. The available bandwidth is a function of a level of contention between the active message and other active messages on the path. The level of contention is determined in accordance with the contention structure and the routing structure for the active message. Finally, after determining the available bandwidth the system calculates, for the active message, based upon the available bandwidth, a communication delay.

The present invention also comprises a computer system including program code capable of carrying out the above-described steps.

The resulting models generated in accordance with a particular embodiment of the present invention are advantageously incorporated into a performance technology infrastructure for predicting performance of a particular system under a particular specified load. Such performance technology infrastructure is set forth, by way of example, in Papaefstathiou, U.S. patent application (serial number not yet assigned), entitled: "A PERFORMANCE TECHNOLOGY INFRASTRUCTURE FOR MODELING THE PERFORMANCE OF COMPUTER SYSTEMS," filed Aug. 4, 2000, explicitly incorporated herein in its entirety.

The results of such performance analyses can be used within an operating system to perform scheduling, dynamic load balancing, and system configuration. In addition they can be used during application development to study scalability, bottlenecks, performance prototyping, and capacity planning.

BRIEF DESCRIPTION OF THE DRAWINGS

The appended claims set forth the features of the present invention with particularity. The invention, together with its objects and advantages, may be best understood from the following detailed description taken in conjunction with the accompanying drawings of which:

FIG. 3 is a table summarizing a set of events making up the workload input provided by the translation stage of FIG. 2;

FIG. 4 is an exemplary network topology modeled in an exemplary delay model determination procedure;

DETAILED DESCRIPTION OF AN ILLUSTRATIVE EMBODIMENT

The delay model generation method and system represents, in a satisfactory level of detail, network characteristics to predict the performance effects of interest to a software engineer or system administration. The performance effects include link contention, message routing, bottleneck identification, and background loads. The delay model does not require a representation of the physical and protocol layers of a network.

The delay model is generated through the execution of a sequence of stages including: receiving a workload definition, generating routing structure (arrays), calculating contention structures (arrays) representing usage of network links/channels by simultaneously active message events, calculating bandwidth availability and resulting message data transmission rates, and rendering a communication cost for completing transmission of a message in view of current network transmission load conditions. Communication event and non-communication event cost values are analyzed to identify an event horizon corresponding to the shortest duration before one of the events completes. The information produced during the evaluation of the model can range from overall statistics to a detailed account of the system operation.

In an embodiment of the present invention the delay model generation method assumes that the network uses packet switching. Packet switching networks sub-divide long messages to short packets and then transmit the packets as in message switching systems. Accordingly a single link can be used by multiple messages. A user can customize the network characteristics including the topology, routing algorithm, and cost model. The model evaluation method introduces abstractions that allow a user to define the system without the need to understand or modify the evaluation process and internal delay model calculations.

Figure 1:
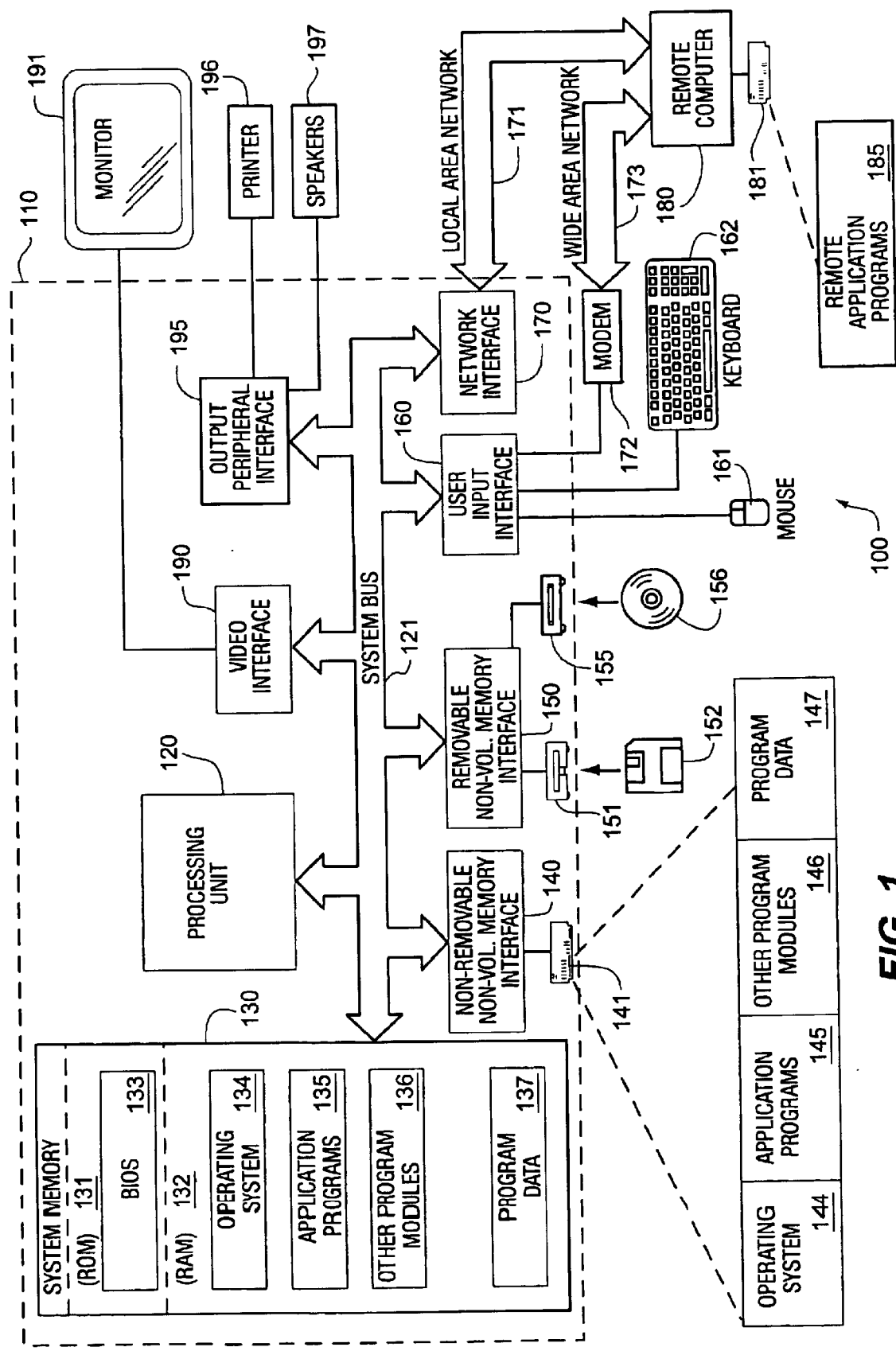
FIG. 1 is a schematic drawing illustratively depicting an exemplary operating environment for carrying out an embodiment of the present invention.

FIG. 1 illustratively depicts an example of a suitable operating environment 100 within which the invention may be implemented. The operating environment 100 is only one example of a suitable operating environment and is not intended to suggest any limitation as to the scope of use or functionality of the invention. Other well known computing systems, environments, and/or configurations that may be suitable for use with the invention include, but are not limited to, personal computers, server computers, handheld or laptop devices, multiprocessor systems, microprocessor-based systems, programmable consumer electronics, network PCs, minicomputers, mainframe computers, distributed computing environments that include any of the above systems or devices, and the like.

The invention is operational with numerous other general purpose or special purpose computing system environments or configurations. Examples of well known computing systems, environments, and/or configurations that may be suitable for use with the invention include, but are not limited to, personal computers, server computers, handheld or laptop devices, multiprocessor systems, microprocessor-based systems, set top boxes, programmable consumer electronics, network PCs, minicomputers, mainframe computers, distributed computing environments that include any of the above systems or devices, and the like, either alone or in combination.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of compute readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through a output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Having described exemplary computing environments in which the present invention is carried out, attention is directed to FIGS. 2–6 depicting an exemplary set of model generation stages and a method incorporating the stages to render a communication model (also referred to as a modeled delay) for a particular execution environment taking into consideration both network topology and representative load conditions. Such method is carried out in computer system comprising a computer executable set of instructions in association with a set of data inputs. After depicting each of the stages in isolation, an exemplary set of steps are depicted in the form of a flowchart in FIG. 6 that combine the stages in an exemplary arrangement to render output traces for a modeled multiprocessing topology and load arrangement. Furthermore, the present invention is highly customizable and a wide variety of modifications to the disclosed embodiments of the invention include modifications to input format and output format. In such cases desired input and output formats are accommodated through compiling, translating, interpreting, etc. to achieve desired transformations. It is further noted that with regard to each computational stage, that alternative forms or disclosed steps may also be performed in accordance with alternative embodiments of the present invention.

Figure 2:
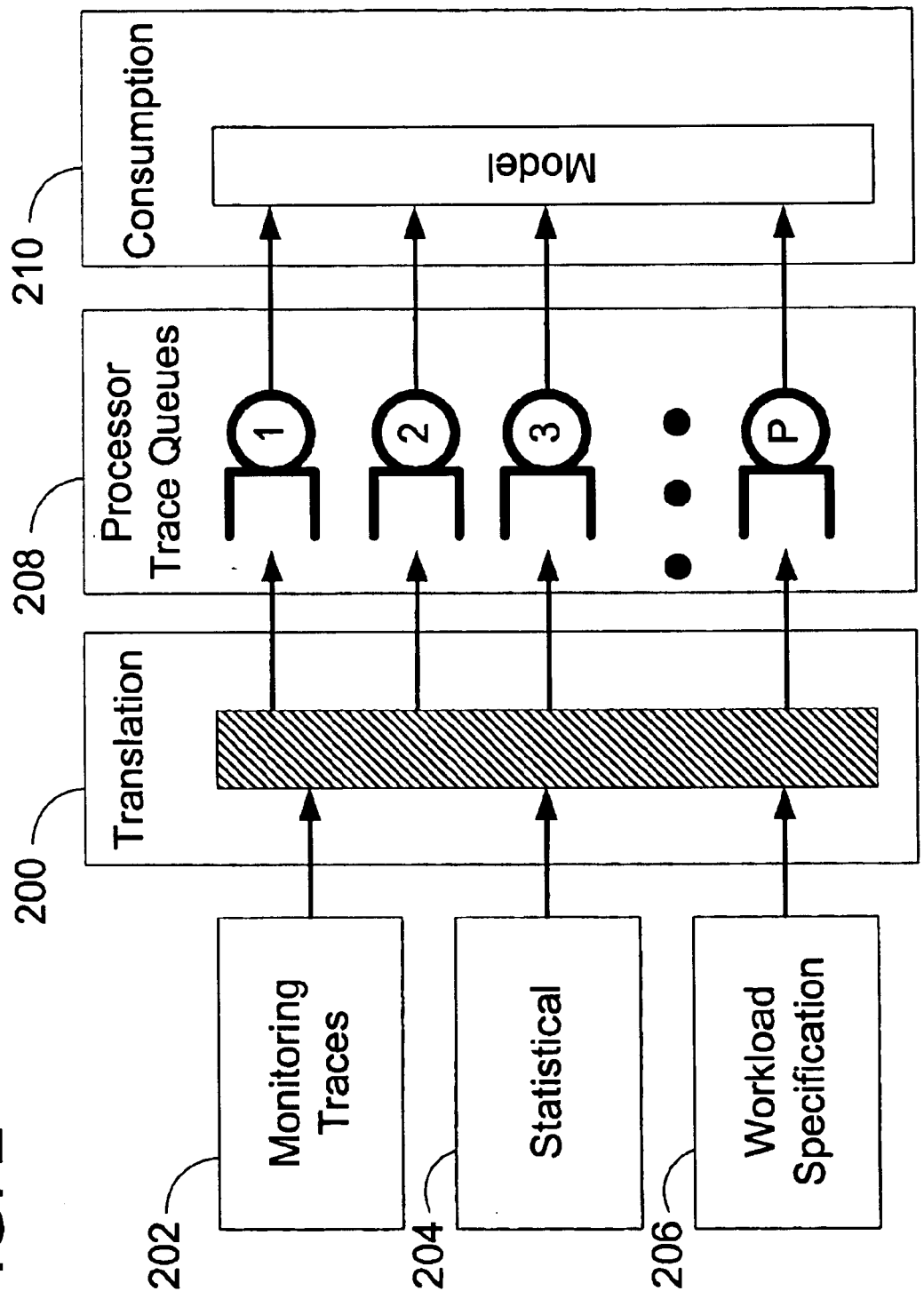
FIG. 2 is a schematic drawing depicting, at a high level the components of a system for creating a delay model in accordance with an embodiment of the present invention.

Turning to FIG. 2, a communication workload is defined for a particular model. The representation of the communication workload includes a specified set of events, including, by way of example, complex interactions of different types of events. The workload definition characterizes the events that affect the communication status of the network connecting various processing nodes. Exemplary events include point-to-point communications, collective communications (e.g. broadcasts), processing, and synchronizations. The workload model is organized and processed into a set of event sequences that maintain the causality and event relationship of an initial application modeled by the input sequence.

As shown in FIG. 2, a source for workload definition is potentially provided from multiple sources to a translation stage 200. For example monitoring traces 202 are rendered by monitoring tools observing the operation of a system and the commands generated by an actual system under an exemplary load. Alternatively, a statistical workload 204 is submitted to the translation stage 200. When only the statistical behavior of the application is known, detailed traces are generated by simulating application behavior. The resulting statistical workload 204 is a representative mix of commands/requests based upon a statistical analysis of an application or applications of interest. Finally, a workload specification 206 is submitted to the translation stage 200 comprising a set of events specified by a wide potential variety of means.

The translation stage 200 receives the input workload definition and digests (compiles) the input into a set of events in accordance with a set of event types. An exemplary set of event types are set forth in the table depicted in FIG. 3, addressed further below. The output of the translation stage 200 comprises a set of event sequences corresponding to a set of simultaneously executed processes, event strings, etc. The translation stage 200 potentially includes adapting a trace format to an internal representation and breaking down complex trace types (e.g. collective communications) to supported basic event types. The event sequences generated within the translation stage 200 are stored into processor event queues 208. The processor event queues are consumed during an evaluation stage 210 described herein below.

Potential features of the workload specification/ translation stages include support for complex event types including conditional multiple send or receive communication statement event types. For example a Message Passing Interface (MPI) program can specify that a processor might receive multiple asynchronous messages from other processors and the message that is immediately available should be received first. MPI is the standard library widely used to describe the communication stages of a parallel program.

Turning now to FIG. 3, an exemplary set of basic event types are identified and summarized. The exemplary set includes communication primitives that are common to known message passing libraries such as, by way of example, MPI and FM. The event types represented in FIG. 3 correspond to the majority of communication functions defined in a high-level communication library such as MPI. A Processing event 220 is associated with a time period and represents a period of time in which a particular process or thread will not issue any messages on the network.

A blocking send event 222 is associated with a source processor, target processor, and a message length. The blocking send event 222 represents a processor sending a message of a specified length to another processor. No further operations are processed by the source processor until the send event completes.

A blocking receive event 224 is associated with a source processor, target processor, and a message length. The blocking receive event 224 represents a processor receiving a message of a specified length from another processor. No further operations are processed by the target processor until the receive event completes.

Continuing with FIG. 3 event types, an asynchronous send event 226 is associated with a source processor, target processor, and a message length. The asynchronous send event 226 represents a processor sending a message of a specified length to another processor. However, in contrast to a blocking send event 222, the processor may instantly begin processing a next event.

An asynchronous receive event 228 is associated with a source processor, target processor, and a message length. The asynchronous receive event 228 represents a processor receiving a message of a specified length from another processor. However, in contrast to a blocking receive event 224, the processor may instantly begin processing a next event without waiting for the completion of the receive event.

In accordance with an embodiment of the present invention, a barrier event 230 is associated with a list of processors. In the barrier event, all specified processors proceed after all have reached the barrier (synchronization) event.

In the embodiment of the invention, complex events are represented as a group of the supported event types. Synchronous and asynchronous communication sends and receives can be combined. Thus, by way of example, the function MPI_Reduce is used when the data from the processors is being sent to a master processor and then combined using a binary operation. This type of collective communication can be emulated by synchronous sends from the slave processors to the main and synchronous receive by the main processor. The reduce operation performed in the master can be expressed by a processing event.

Having described a workload definition and an exemplary set of events used to represent the workload definition, attention is now directed to an execution stage of the present invention where a routing array (RA) is generated, in accordance with a traffic model, to represent the use, by a message event, of links in a particular network connection topology. In an embodiment of the invention, the RA is a two-dimensional matrix. The "columns" represent each of the links (or more generally the channels) in the network, and the "rows" represent the direction of travel of the message. In the event that simultaneous bi-directional (full-duplex) transmission is supported, two rows will be present in each RA. Thus, each array represents the links used to transmit a message in accordance with a particular event. In the particular embodiment, a non-zero value is inserted into each link utilized to transmit a particular message to a particular destination processor. In an alternative embodiment, physical links supporting multiple channels may be modeled by adding rows or columns representative of the channels supported by the physical links. Each routing array is, by way of example, represented as follows in accordance with the following expression (1):

$$RA^m = \begin{bmatrix} b_{d1}^{l1} & b_{d1}^{l2} & \ldots \\ b_{d2}^{l1} & b_{d2}^{l2} & \ldots \end{bmatrix} \quad (1)$$

In the above expression, m corresponds to the message number. Each array element is either 1 (when the message traverses a link in the specified direction) or 0. However, in an alternative embodiment of the invention, the potential range of values in each array element may be expanded to represent the relative cost of using a particular link to transmit a message. RAs eliminate the need to define any further network topology information. They are created by a routing function that can describe either static or dynamic routing. The routing function, depending on the type of routing, will either always generate the same RAs (in static routing) or generate different RAs (in dynamic routing) each time the routing function is called in association with execution of a message event.

Turning briefly to FIG. 4 an exemplary network topology, comprising a 3×3 GRID multiprocessor system, is depicted with an exemplary depiction of two simultaneous messages contending for certain links on the network. As shown in FIG. 4, a total of nine processors are connected via a total of twelve (12) bi-directional links. The resulting routing arrays for the two contending messages (1 and 2) are as follows in (2) and (3):

$$RA^1 = \text{routing}(1, 9) = \begin{bmatrix} 1 & 1 & 0 & 0 & 1 & 0 & 0 & 0 & 1 & 0 & 0 \\ 0 & 0 & 0 & 0 & 0 & 0 & 0 & 0 & 0 & 0 & 0 \end{bmatrix} \quad (2)$$

$$RA^2 = \text{routing}(2, 6) = \begin{bmatrix} 0 & 1 & 0 & 0 & 1 & 0 & 0 & 0 & 0 & 0 & 0 \\ 0 & 0 & 0 & 0 & 0 & 0 & 0 & 0 & 0 & 0 & 0 \end{bmatrix} \quad (3)$$

The RAs set forth above embody the route that each message follows from source to destination by determining the links and direction traveled by each message through a particular link. In the case of a link shared by simultaneous distinct messages, the throughput of the link is shared by the simultaneous messages thereby increasing a contention factor and increasing a communication delay associated with each message. Thus, in accordance with an embodiment of the present invention, the RAs for simultaneous messages are summed to form a contention array (CA) in a contention determination stage. The contention array represents the relative congestion of various links on a network resulting from simultaneously pending active message transmission requests. Where N(msg) corresponds to the quantity of active messages, the contention array (CA) at any particular point in (simulated) time is defined as the sum of the active message routing arrays (RAs) as shown in (4):

$$CA = \sum_{i=1}^{N_{msg}} RA^i \quad (4)$$

The values in each cell of CA include the number of messages traveling through each link and direction. In the above example the CA for the messages 1 and 2 as shown in (5) is:

$$CA = RA^1 + RA^2 = \begin{bmatrix} 1 & 2 & 0 & 0 & 2 & 0 & 0 & 0 & 1 & 0 & 0 \\ 0 & 0 & 0 & 0 & 0 & 0 & 0 & 0 & 0 & 0 & 0 \end{bmatrix} \quad (5)$$

In accordance with an evaluation portion of the contention determination stage in the exemplary embodiment of the present invention, the maximum contention factor for each message (i.e., where a bottleneck occurs) is determined, as shown in (6) by finding the maximum element (msgc) of the CA for the links that are used by a specific message m simultaneously active message requests:

$$msgc(m) = \underset{i=1}{\overset{Nlink}{\text{Max}}} \underset{i=1}{\overset{Ndir}{\text{Max}}} (RA_{ij}^m \cdot CA_{ij}) \quad (6)$$

where $N_{link}$ are the number of links and $N_{dir}$ the number of possible link directions (1 or 2). In the present example, the maximum contention value is two (2) for both messages.

The maximum contention factor provides a relative value relating to the amount of sharing that must occur with regard to a particular link that is used to transmit a message. A communication delay depends on a number of factors including: the physical characteristics of the network, protocol, contention factor ("msgc" above), and length of the message. In some cases the number of hops between processors or network components (e.g. switches) also effects the communication delay. However, the model presented in the exemplary embodiment of the invention assumes that the physical characteristics and operating system overheads (e.g. protocols) cannot be modified by a system user and thus can be assumed are given (i.e. constant).

Before describing the communication cost determination stage performed in accordance with an embodiment of the present invention, it is noted that a communication delay of a single message traveling through a quiet network (without any link contention) can be determined by creating a regression model of communication cost based upon message length and number of hops between a source and target processor. Measurements for a range of point-to-point communications scenarios are obtained by benchmarking. Such values are then used to determine a set of regression parameters.

A generic model for modern network architectures has been proposed in M. Shroff and R. A. van de Geijn, "CollMark: MPI Collective Communication Benchmark," http://www.cs.utexas.edu/users/plapack/CollMark/, (submitted to Supercomputing 2000). The model expresses the delay for message transmission as a function of message length and the number of links traveled by the message between two nodes (distance). The message communication cost determination also considers the pipeline effect of packets traveling through the links. The generic model provides a method for determining the communication delay in a quiet network and can be expressed as follows in (7) as:

$$T_{sys}(l,d) = b_0 + \left(d + \frac{l}{s_p} - 1\right) \cdot (b_1 + s_p \cdot b_2) \qquad (7)$$

In the above equation, l is the length of the message, d is the number of hops (i.e., the distance) between source and destination for a message, $s_p$ is the size of the packet, $b_0$ the message start-up time, $b_1$ the channel transition cost, and $b_2$ the cost for sending a single byte. The regression parameters, determined by experimentation are $b_0, b_1, b_2$.

The regression model set forth above determines the cost of a communication delay on a quiet network. To extend this model to include link contention and background load, "bandwidth availability" (BA) is determined during a bandwidth availability determination stage in accordance with an equation set forth herein below. Bandwidth (B) corresponds to the maximum achievable speed of communication. However, when links are shared by multiple messages, the observed bandwidth of a link is B divided by the number of messages. Additionally, part of the bandwidth may, in some instances be consumed by background network load. Background network load is the load generated from external workloads, not modeled within the current system. For a message that utilizes more than one link, the BA should be calculated for the link that has the highest contention factor. This is the bottleneck link of the message and determines the effective bandwidth. The expression for determining BA for a message is shown in (8).

$$BA(m) = \frac{r_\infty - B_{bgr}}{msgc(m)} \qquad (8)$$

In the above equation, $B_{bgr}$ is the background load, m is the message number, and $r_\infty$ is the asymptotic bandwidth of the link. The asymptotic bandwidth of communication over a link is approached as the message length approaches infinity. The benchmark RINF, part of the ParkBench suite, can provide a suitable value for $r_\infty$. In another embodiment, the parameter $r_\infty$ can be approximated by an observed bandwidth for a large message transmitted over the link. Though usable in yet another alternative embodiment of the invention, a value corresponding to the peak physical bandwidth of the network is not a preferred approximation of $r_\infty$ since it does not include the overheads introduced by protocol, operating sytem, and communication libraries. It is further noted that the background load in most cases is not constant during the simulated time. The statistical characteristics of $B_{bgr}$ can be represented in a regression model or a stochastic process. In both cases is can be calculated by a function that varies over time. Where time corresponds to a current value of a simulated clock.

In view of the above further refinements introduced by bandwidth availability and background load in a network link, the communication delay for a message, taking into account the link contention and the background load, can be calculated as shown in (9) by:

$$T_{com}(m,l) = BA(m) \cdot T_{sys}(l,h(m)) \qquad (9)$$

In the above equation, m is the message number, l is the length of the message, h(m) is a function that determines the hops traveled by the message, and $T_{sys}(l,h(m))$ is the communication regression model for a quiet network. The hops function is defined in (10) as:

$$h(m) = \text{Max}_{i=1}^{Nlink}\text{Max}_{i=1}^{Ndir}(RA_{ij}^m) \qquad (10)$$

The above equation represents the summing of the values of the routing array elements for a message (m). Thus, the communication delay $T_{com}$ for a particular message m having a length l comprises a time for transmitting the message through a quiet network ($T_{sys}$) times a bandwidth availability (BA) of the network links that transmit the message.

The communication cost model determines a communication delay assuming that the status of the network remains static (steady state) during the course of completing the entire message transmission. However, communication traffic changes each time a new message enters the system or an existing message completes. Consequently, the status of the network might change many times during the lifetime of a message. The change in active messages potentially changes the state of the contention arrays associated with the set of active messages. Thus, in accordance with another aspect of the embodiment of the present invention the evaluation engine that is responsible for calculating the delays for each of the pending transmission requests identifies a next event that will start or complete based upon the current state of the contention array and the current set of active message events.

In an embodiment of the present invention a list of events is created for each processor based on the type of trace that is in the top of the workload queue. A single trace can result in the production of a sequence of events. For example, a synchronous send operation might create two events: first the source processor waits for the destination processor to be ready (wait event), and second it sends the message. In some instances more than a single trace is processed in each traffic state. This is the case for asynchronous communication operations that can be performed in parallel with other operations. For example, a processor commences an asynchronous send and immediately continues to a processing event.

Figure 5:
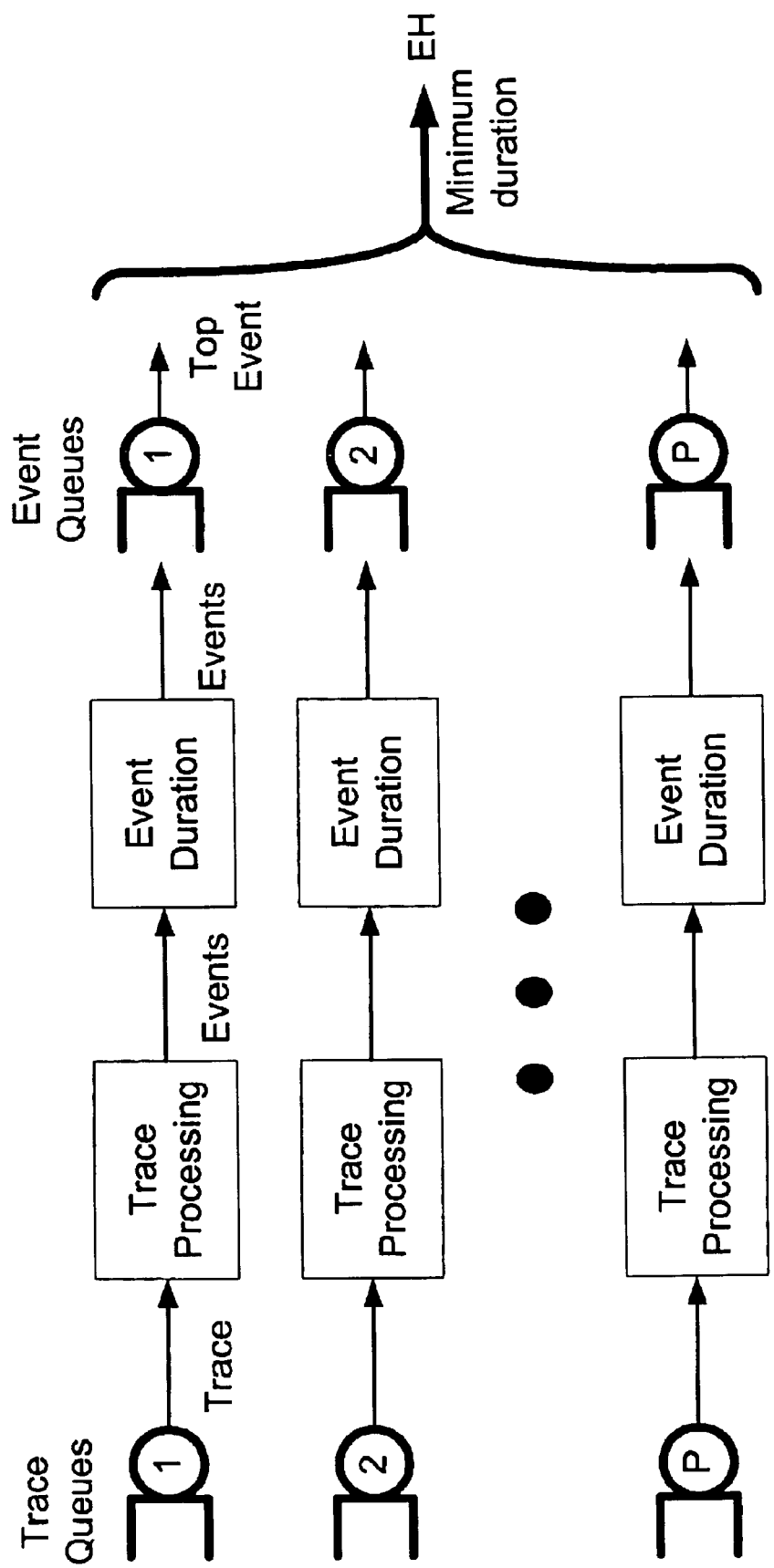
FIG. 5 schematically depicts the flow of information and processing to compute remaining event durations and an event horizon.

After the event list has been defined the duration of each event is determined. As depicted in FIG. 5, this process includes calculating the communication delays for all events that are in the top of the processor event list. The event with the shortest duration to completion or creation determines the event horizon (EH). The event horizon defines the duration of the next steady state of the system. For this period the network traffic remains steady.

The initial calculation of a communication delay is based on the assumption that the traffic of the system remains the same throughout the duration of the message. If a determined EH is shorter than the communication delay calculated for an active message, the portion of the message transmitted up to the point of the EH is determined. A new communication delay is calculated for the remaining portion of the message and the new network traffic state. In accordance with an embodiment of the present invention a function (an inverse of $T_{sys}$, defined herein above) returns the number of bytes consumed of a message in a period of time defined by the event horizon EH and given the number of hops. For the case of the delay model described herein above, this function is defined in (11) as:

$$T_{sys}^{-1}(EH, d) = \left( \frac{EH - b_0}{b_1 + s_p \cdot b_2} - d - 1 \right) \cdot s_p \qquad (11)$$

Preferably, the initial start-up and pipelining costs are not included multiple times in the cases of messages that communicate through more than one EH period. This can be achieved by using two separate $T_{sys}()$ models, one for the initialization of the message and another one for consequent traffic states.

Figure 6:
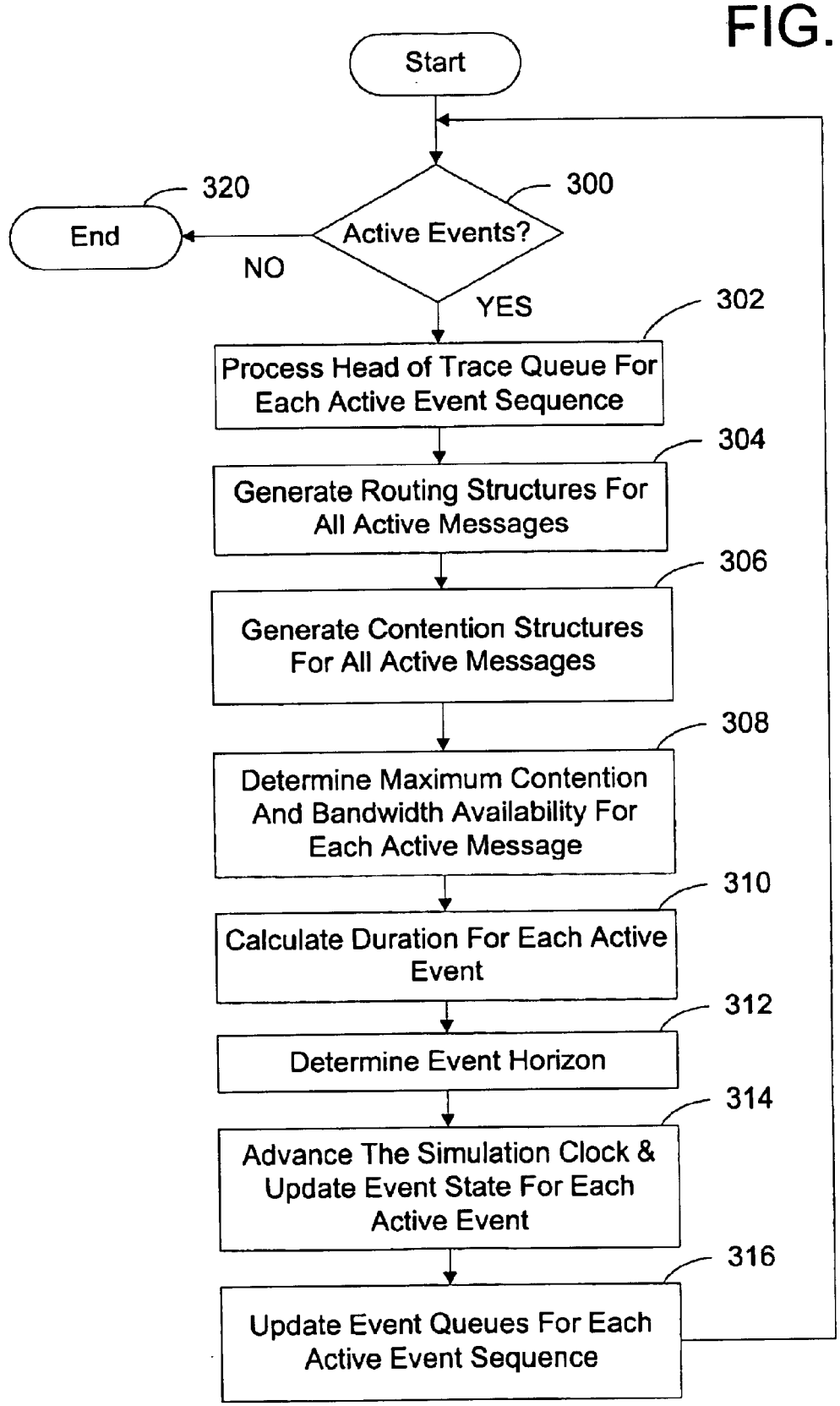
FIG. 6 is a flowchart summarizing the steps for generating output traces for purposes of providing a delay model in accordance with an embodiment of the present invention.

Having described the computational components of the stages incorporated into a modeled delay calculation in accordance with various embodiments of the present invention, attention is directed to a flowchart set forth in FIG. 6 that summarizes steps performed to generate a set of modeled delays corresponding to events arising from processed workload trace queues. During step 300 the workload trace queues for processes are inspected, and if active events (those in need of processing) exist, then control passes to step 302. At step 302, the head of each workload trace queue (built within the translation stage 200) is retrieved for processing to render a set of events. By processing only the head of each queue, it is possible to handle contingent processing events. Upon completion of step 302, a set of active process events is available for further processing in accordance with the event processing steps described herein.

If at step 300 there are no active events (e.g., the workload trace queues are empty), then control passes to the End 320. Alternatively, the system checks to see whether there are idle events. If such events exist, then the time clock is advanced to the first point in time where an event becomes active and processing continues to step 302 wherein the head of the workload trace queue(s) is handled.

Next, during step 304 a routing array is generated for each active message (e.g., one that is currently being transmitted). Each routing array, corresponding to an active message event, identifies the links within a network that are traversed by a message associated with the messaging event. The routing array is a convenient way to represent the links traversed by message passed between two processor nodes in a network to facilitate summing of instances of routing arrays corresponding to simultaneously active messaging events. However, routing arrays are only one example of a routing structure that may be used to store the relevant link traversal information for active messages. In alternative embodiments other data structures including records, linked lists, strings, etc. are used. Those skilled in the art will appreciate the vast variety of different data structures available for fulfilling the function performed by the routing arrays.

Next, during step 306 a contention array is generated based upon the routing arrays generated during step 304 for active messages. The contention array provides a summary view of link usage by active messages during a particular point in time. An array structure is an exemplary form for representing contention between active message events. However, a contention structure, for which a contention array is just one example, includes a wide variety of data structure types including arrays, records, linked lists, strings, etc. As those skilled in the art will appreciate in view of the preferred and alternative embodiments disclosed herein, there are a variety of suitable manners in which to store and represent contention information corresponding to multiple simultaneously active message events. Control then passes to step 308.

At step 308 a maximum message contention value is determined for each active message. In the exemplary embodiment, as disclosed herein above, the maximum contention value is generated for each message by multiplying elements of the routing array (or more generally routing structure) for each active message by corresponding elements of the contention array (structure). In the exemplary embodiment, where the values of the routing arrays are either one or zero, this step in effect comprises searching out, for each active message, the highest value in the contention array/structure corresponding to a link/channel used to transmit the message. Those skilled in the art will appreciate the wide variety of methods that can be utilized to determine a maximum contention value based upon a network path traversed by a message and the relative transmission bandwidth available to transmit the message over individual links in the traversed path.

After identifying the maximum contention for each message, in the exemplary embodiment of the present invention, a bandwidth availability factor is generated for each message during step 308. As disclosed hereinabove, the bandwidth availability is an approximate value that takes into consideration the maximum throughput of a particular link and reduces that value by at least taking into consideration sharing the available bandwidth with other active messages. In the exemplary embodiment of the invention, the maximum bandwidth is reduced by a background load value. Thereafter, the resulting value is reduced to a fraction of the remaining bandwidth based upon a share allocated to the particular message. In the above described BA calculation, the total available bandwidth (after subtracting load) is divided by the maximum contention value. Thus, as contention increases on a particular link in a message path through a network, the value of BA for a particular message using the link is reduced.

In the exemplary embodiment, each message is allocated an equal share of the available bandwidth. Therefore, if three messages are active on a particular link/channel, then each message is allocated a third of the remaining bandwidth (after subtracting background load bandwidth). It is noted that a variety of different formulas can be utilized to calculate bandwidth availability for a particular message at a particular time, and can be utilized in the alternative to carry out the present invention. It is further noted that bandwidth availability determination may immediately follow the determination of a maximum contention value for a particular message or bandwidth availability can be determined after multiple maximum contention values have been generated for multiple active messages. Thus, calculating a maximum contention value and bandwidth availability for each active message are grouped within step 308.

The events arising from execution of the multiple simulated simultaneous processes typically include events that do not rely upon transmission of messages. Such events may consume a substantial amount of time thereby justifying incorporation into a simulation of the streams of events arising from active processes. Thus, at step 310 the duration to completion is calculated for each active event (both communication and noncommunication). In the case of communication events, as described herein above, in the exemplary embodiment of the present invention the duration is obtained by multiplying the time to pass a remaining portion of a message through a quiet network by a fractional value corresponding to the bandwidth availability (BA) value calculated for the particular message portion. It is noted that the calculation of duration values for completing events at a particular simulated point in time is independent of other simultaneously active events, and thus the order in which the event durations are computed is not important. Upon completing step 310, a set of duration values are provided that identify a duration to completion of all the active events based upon the network load created by the currently active communication events.

Next, control passes to step 312 wherein the durations calculated during step 310 are compared to determine a shortest remaining duration. The shortest remaining value defines the event horizon (EH). This stage is illustratively depicted, as noted above, in FIG. 5. Control then passes to step 314 wherein, the simulation clock is advanced based upon the EH, and the state of completion is updated for each active event in accordance with advancing the simulation clock to the event horizon determined during step 312. As explained above, if a remaining time for completing transmission of a particular message is greater than the EH, then the portion remaining of the message at the time the EH is reached is determined. In the exemplary embodiment, an inverse $T_{sys}$ (i.e., $T_{sys}^{-1}$) value is calculated that equals the portion of the message consumed when the EH is reached. This value is subtracted from the previous message size to determine a remaining portion of the message. The importance of this updating step with regard to active messages is to account for changes in the network contention array when an active message event completes.

After updating the state of active events and deleting any completed events during step 314, control passes to step 316 wherein event queues are updated for all active event sequences based upon the current value of the simulation clock. Control then returns to step 300. Upon completion of the repeated loops, sequences of particular executed events and associated times for completion will be rendered. Such information may be used in a variety of manners including generating output traces, generating statistical data, etc. using a variety of output analysis tools. In a particular use, the output is used to provide a model for a particular network topology and workload type in association with a performance technology infrastructure. Such an infrastructure is disclosed in Papaefstathiou, U.S. patent application (serial number not yet assigned), entitled: "A PERFORMANCE TECHNOLOGY INFRASTRUCTURE FOR MODELING THE PERFORMANCE OF COMPUTER SYSTEMS," filed Aug. 4, 2000, explicitly incorporated herein by reference in its entirety.

Figure 7:
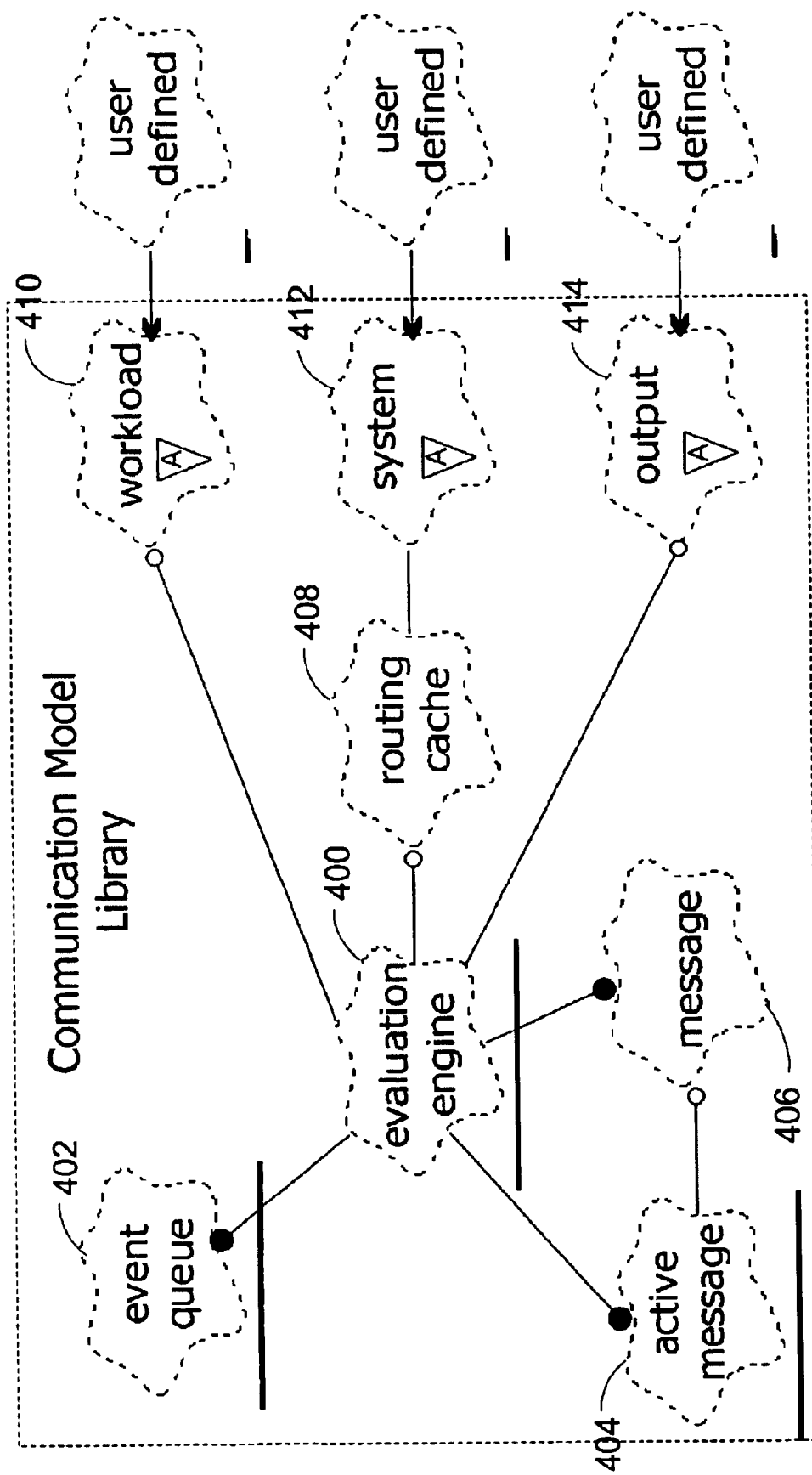
FIG. 7 is schematic drawing depicting the components of object classes comprising a library for generating a delay model in accordance with an embodiment of the present invention.

Having described individual stages and an exemplary set of steps for generating a set of communication delay values, an exemplary implementation of the above described stages and procedures is now described in association with FIG. 7. An embodiment of the present invention is implemented as a C++ library function linked as part of a performance prediction and analysis tool infrastructure. The library function provides easy customization of the network characteristics, the workload format, and the type of result created during the evaluation of a model set of event sequences including communication events. It also includes a routing array cache that minimizes evaluation time. A class diagram of the library is shown in FIG. 7 in accordance with an embodiment of the present invention.

The components of the library function include an evaluation engine 400. The evaluation engine includes the software for carrying out the model evaluation procedure summarized in FIG. 6. The evaluation engine 400 combines the workload information with the network configuration to create the routing and contention arrays. The evaluation engine 400 also handles a traffic state transition model and updates the status of active events. An event queue 402 manages the event queue generated from processing of workload traces. The event queue 402 includes the various operations performed on the event list including the calculation of an EH.

Active message class 404 and message class 406 manage the status of messages during their lifetime. The message class 406 includes the static characteristics of the message while the active message class 404 includes the current status of the message while it travels the network and during the traffic state transitions.

A large part of the evaluation time is spent calculating the message routing. The routing algorithm creates the routing array (RA) for the new active messages in each traffic state transition. The routing cache class 408 stores the routing arrays into cache. When the evaluation engine 400 requests a routing operation the routing cache is searched to obtain a previous copy of the routing array if one exists.

A workload class 410 is an abstract class that provides an interface to the user specified workload format. The user definition might include the reading of any type of traces created by a monitoring, statistical simulation, and workload specification. The traces are then translated to the appropriate format as defined in the workload class 410.

A system class 412 is an abstract class that provides an interface between the evaluation engine and the network characteristics. It includes the routing algorithm, network configuration, and cost model for a simulation. Finally, the library provides detailed output traces about the operation of the network during the evaluation process. The user provides an output trace class 414 that renders visual output of the network status, provides performance statistics, and/or generates traces for a separate visualization tool.

It is noted that the memory requirement for the evaluation process described herein increases linearly with the number of processor nodes and the number of interconnection links. The size of the routing cache can be adjusted. The speed of the evaluation depends on the network characteristics (e.g., routing complexity) and the number of traffic state transitions generated during the course of a simulation. Specific evaluation times are presented in the discussion that follows below.

A user can extend the communication delay calculation system to provide an arbitrary level of detail for the operation of the network and any output format. With regard to output formats, such extension is provided by the output trace class 414. The network status output information includes the routing, bottleneck, and communication costs. Additionally results of processing all non-communication traces and traffic state transition details can be included in the output file. A trace output class produces output traces for Mathematica. A Mathematica module analyzes the traces and produces a number of performance analysis graphs for the test workloads. In another output trace class, the knee capacity of a network is generated for particular input workloads by graphically depicting the throughput of the network in packets/sec for a message passing through the link having the highest load (i.e. is the bottleneck of the system). In accordance with yet another output trace class, space-time diagrams are generated. Space-time diagrams are generated by monitoring visualization tools to show an overall view of the system operation. In a particular example, a time line is generated for each processor and showing four basic types of events (idle, send, receive, and wait). The idle event corresponds to processing while the wait event corresponds to delays due to synchronization. Lines between processor graphs connect the time line graphs to denote a communication. Space-time diagrams are of great value to programmers as a guide to the programming and performance debugging process.

Figure 8:
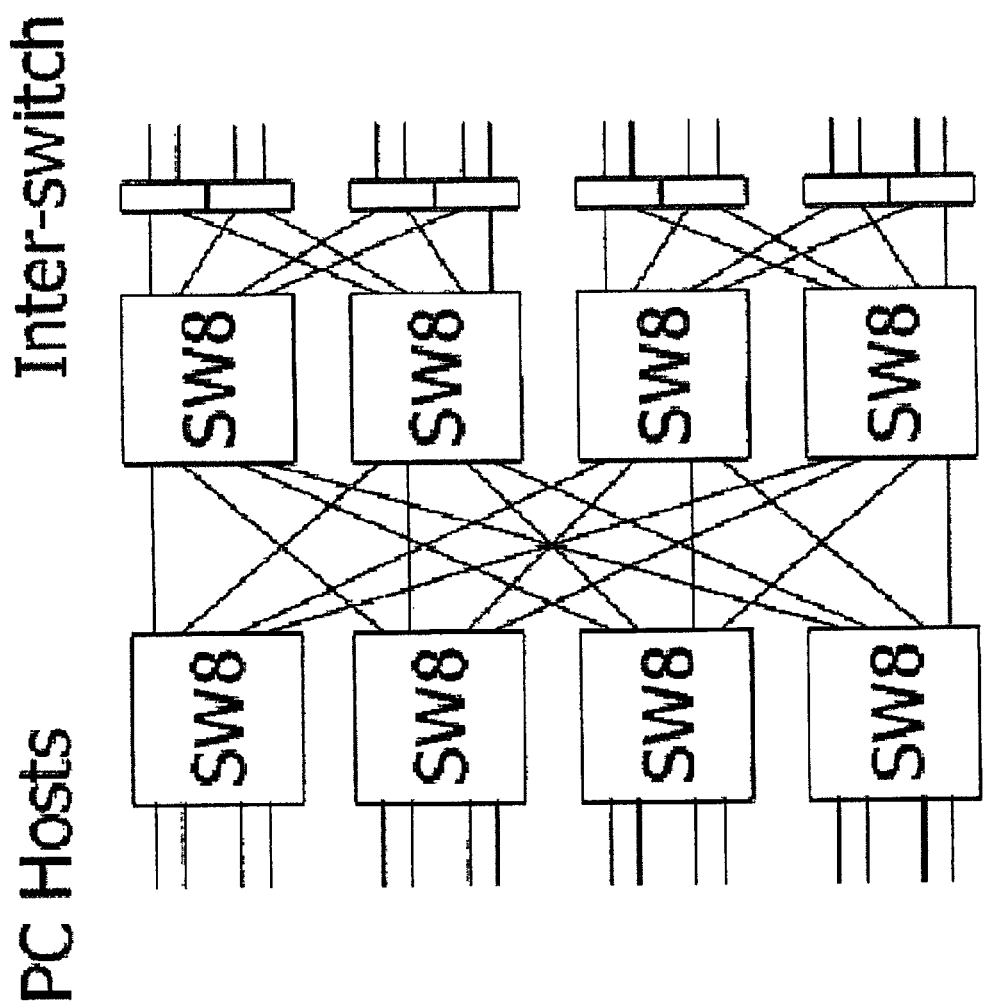
FIG. 8 a schematic drawing of a multistage ATM network that includes 16 SAN connections to PC hosts and 16 ports for inter-switch connection.

The following experimental results were obtained from executing an embodiment of the present invention in association with a particular network connection topology including a system of 16 PCs connected via a Myrinet SAN switch (M2M-OCT-SW8). The simulated switch is a multistage ATM network that includes 16 SAN connections to PC hosts and 16 ports for inter-switch connection (FIG. 8). The inter-switch ports were inactive for the test system since the cluster only uses a single switch. The peak bandwidth of the Myrinet is 1.28 Gb/s and the latency is 100 ns per 8-port switch. The PCs were 300 Mhz Pentium IIs with 384 Mb of RAM running Windows 2000.

The HPVM-MPI version 1.9 library from University of Illinois was used to run benchmarks and validate the results. Although dynamic routing is possible between the connections in the $1^{st}$ and $2^{nd}$ levels of the crossbar switches, the current HPVM only supports static routing. Dynamic routing can minimize link contention but imposes an additional cost for calculating new routing tables for each communication. Packets include 20 bytes of header and varying size of data of up to 2020 bytes. Benchmarking showed that the cost of communication in a quiet network is independent of the distance of nodes traversed. The communication cost regression function was found to be, as shown in (12):

$$Tcom(l) = \begin{cases} l <= 2020 & 14.68 + 0.0334 \cdot l \\ l > 2020 & 54.87 + 0.0143 \cdot l \end{cases} \quad (12)$$

where l is size of message in bytes.

Two workloads were employed to validate the accuracy of the model predictions. The Fast Fourier Transform (FFT) is a kernel used in many application areas such as image and signal processing. The number of events required to represent the processing and communication pattern is a few hundred. The FFT is performed in a number of stages and each stage includes a different communication pattern. In the first stage there is an exchange of data between neighboring processors, in the second stage second neighbor exchanges take place and this is continued for a total Log(P) stages where P is the number of processors. In each stage the communication pattern is regular but the level of contention varies from stage to stage.

The second workload was obtained from the Sweep3D application that is part of the ASCI application suite. Sweep3D is a complex benchmark for evaluating wavefront application techniques used to evaluate advanced parallel architectures at Los Alamos Applications. The communication pattern is typical of data parallel grid based applications. The workload traces for the various problem sizes and processor configurations varied from few tens of thousands to hundred of thousands events for array size from 50×50× 50 to 200×200×200 elements.

The workload traces were created by the PACE workload characterization tool. PACE includes a Performance Specification Language (PSL) that supports the definition of the performance characteristics of the application. When the source code of the application is available a static analysis tool parses the code and produces PSL code. PACE then runs the PSL code to emulate the behavior of the application and produce traces that correspond to the events that took place during the application execution.

Validating the above described method for calculating communication delays includes comparing the trace execution times versus performance predictions. A trace executor is developed for this purpose that emulates the processing delays, communication pattern, and synchronizations on the target system. The execution times are compared with performance predictions created by the communication model and a statistical model. The latter is an implementation of the regression communication model (Tcom(l) equations above).

Figure 9:
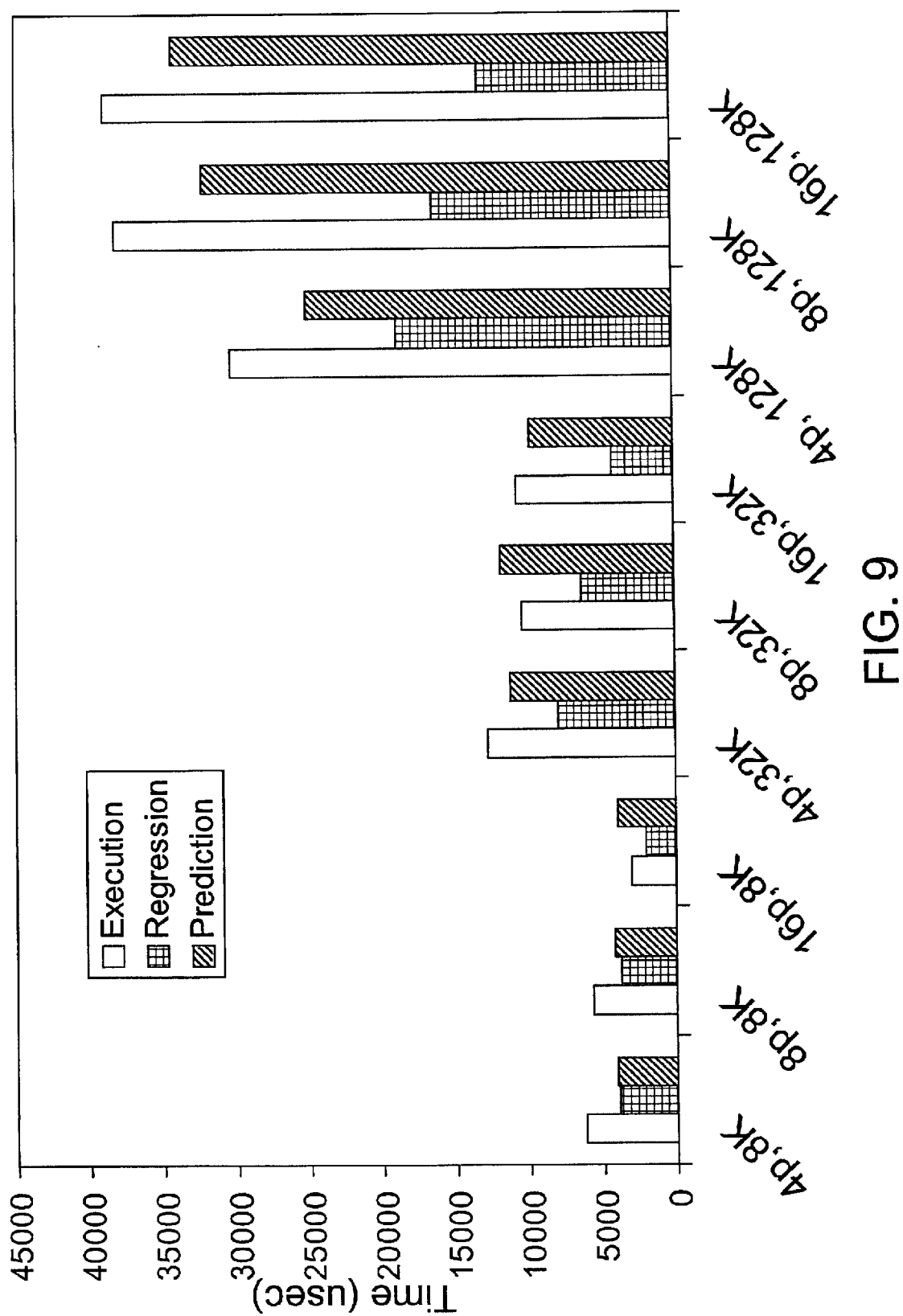
FIG. 9 is a graph comparing execution, regression, and prediction (contention model) times for various problem and system sizes of the FFT.

FIG. 9 shows a comparison of execution, regression and prediction times for various problem and system sizes of the FFT. The disclosed procedure for calculating/modeling delays in a network provides better accuracy of results than the statistical model. In the smaller problem and system configuration, the contention model error is high (around 35%) while in the larger configuration the error becomes substantially smaller (less than 20%). This is due to timing and initialization overhead that take place during the trace emulation not modeled within the contention model. These effects are more apparent to smaller configurations where the overall trace execution times are shorter (less than 10 milliseconds). The regression model starts with error of 35% percent for smaller configurations and increases for larger configuration for up to 63%. The statistical model always under predicts the execution.

Figure 10:
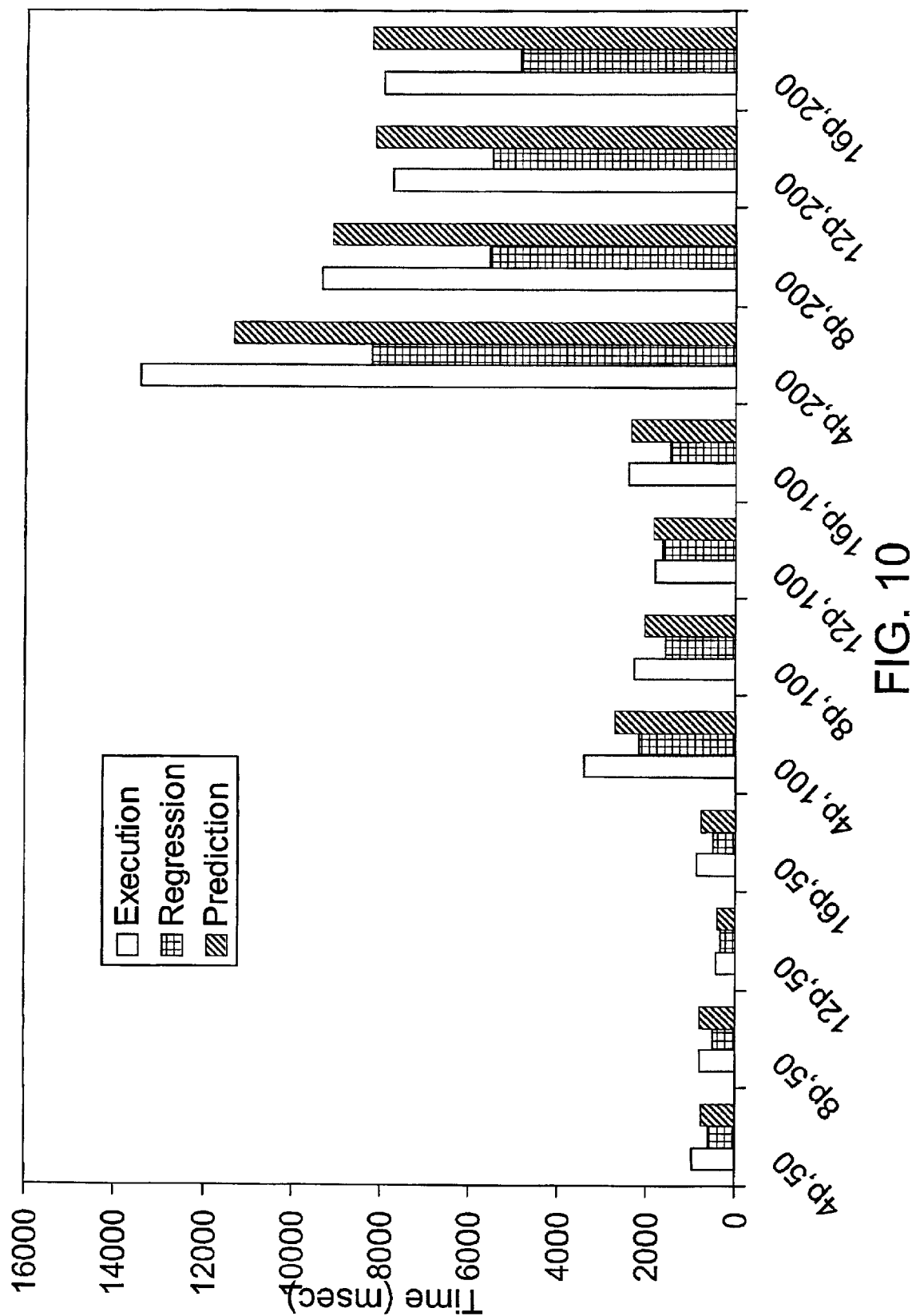
FIG. 10 is a graph comparing execution, regression, and prediction (contention model) times for the Sweep3D.

FIG. 10 shows the execution, regression and prediction (contention model) times for the Sweep3D. The contention model error for small configurations is smaller than the FFT case because the execution times for the Sweep3D, even for small configurations, is an order of magnitude higher and thus the initialization and timing overheads of the trace executor is less. The regression model performs similarly to the FFT results.

One of the requirements for the exemplary communication delay procedure is fast evaluation. The performance of the evaluation depends on many factors including the complexity of the network model (e.g. routing), the number of events generated from the workload traces, and the system performance. For the evaluation of the two test workloads on a Pentium III at 450 MHz running Windows 2000, the FFT for the 16 processor and 128K array size configuration included 131 traces. The communications delay procedure generated 7 EHs, and it takes 2 milliseconds to evaluate (65500 traces/sec). The Sweep3D running on 16 processors and for the 200×200×200 array configuration included 348, 984 traces. The communications delay procedure generated 46944 EHs, and it took 2.726 seconds to complete the evaluation (128020 traces/sec). Thus, the model evaluates large and complex networks and workloads in few seconds to a few minutes, a substantial improvement over existing simulation environments.

Illustrative embodiments of the present invention and certain variations thereof have been provided in the Figures and accompanying written description. The present invention is not intended to be limited to these embodiments. Rather the present invention is intended to cover the disclosed embodiments as well as others falling within the scope and spirit of the invention to the fullest extent permitted in view of this disclosure and the inventions defined by the claims appended herein below.

What is claimed is:

1. A method for generating a delay model in a networked system under a defined workload, the method comprising:

generating, for a first active message, a routing structure based upon a network configuration and a source network node and destination network node of the active message;

creating a contention structure created by summing together routing structure elements for active message events;

first calculating, for the first active message, an available bandwidth for use by the message at a path between network nodes utilized by the active message, the available bandwidth being a function of a level of contention between the first active message and at least a second active message on the path, the level of contention being determined in accordance with the contention structure and the routing structure for the first active message; and second calculating, for the first active message, based upon the available bandwidth, a modeled communication delay to communicate at least a portion of the first active message.

2. The method of claim 1 further comprising:

rendering a set of delay values corresponding to a set of active events; and identifying an event horizon corresponding to a simulated time duration before an event state change.

3. The method of claim 2 further comprising:

advancing a simulation clock based upon the event horizon; and third calculating completed portions of each one of the set of active events based upon the event horizon.

4. The method of claim 3 wherein the event state change corresponds to a message event state change, and further comprising the steps of:

fourth calculating an updated contention structure in accordance with the message event state change and a present set of active message events after the advancing step;

rendering a new set of delay values corresponding to the present set of active events in accordance with the updated contention structure and remaining portions of the present set of active events; and determining a next event horizon in accordance with the new set of delay values.

5. The method of claim 2 wherein the event state change corresponds to a completed active event, and further comprising the step of recording within an output trace record an entry corresponding to the completed active event.

6. The method of claim 1 wherein the routing structure comprises an array.

7. The method of claim 1 wherein the contention structure comprises an array.

8. The method of claim 1 further comprising generating a statistical summary of completed events based upon simulated time durations.

9. The method of claim 1 further comprising the step of processing an input trace sequence to render a set of events including the first active message.

10. The method of claim 9 wherein the input trace sequence is rendered by a translator of a workload definition.

11. A computer system including executable program code for generating a delay model in a networked system under a defined workload, the computer system comprising:

an input stage that receives a workload description and renders event sequences corresponding to the workload description; and an evaluation stage that receives the event sequences and renders timing information representing execution of the event sequences in a distributed processing network configuration, the evaluation stage comprising executable program instructions for:

generating for a first active message, a routing structure based upon a network configuration and a source network node and destination network node of the first active message;

creating a contention structure created by summing together routing structure elements for active message events;

first calculating, for the first active message, an available bandwidth for use by the message at a path between network nodes utilized by the first active message, the available bandwidth being a function of a level of contention between the first active message and at least a second active message on the path, the level of contention being determined in accordance with the contention structure and the routing structure for the first active message; and second calculating, for the first active message, based upon the available bandwidth, a modeled communication delay to communicate at least a portion of the first active message.

12. The computer system of claim 11 wherein the evaluation stage further comprises executable program instructions for:

rendering a set of delay values corresponding to a set of active events; and identifying an event horizon corresponding to a simulated time duration before an event state change.

13. The computer system of claim 12 wherein the evaluation stage further comprises executable program instructions for:

advancing a simulation clock based upon the event horizon; and third calculating completed portions of each one of the set of active events based upon the event horizon.

14. The computer system of claim 13 wherein the event state change corresponds to a message event state change, and the evaluation stage further comprises executable program instructions for:

fourth calculating an updated contention structure in accordance with the message event state change and a present set of active message events after the advancing step;

rendering a new set of delay values corresponding to the present set of active events in accordance with the updated contention structure and remaining portions of the present set of active events; and determining a next event horizon in accordance with the new set of delay values.

15. The computer system of claim 12 wherein the event state change corresponds to a completed active event, and the evaluation stage further comprises executable program instructions for recording within an output trace record an entry corresponding to the completed active event.

16. The computer system of claim 11 wherein the routing structure comprises an array.

17. The computer system of claim 11 wherein the contention structure comprises an array.

18. The computer system of claim 11 further comprising a post output stage for receiving data corresponding to the timing information rendered by the evaluation stage, and generating a statistical summary of completed events based upon simulated time durations.

19. The computer system of claim 11 wherein the input stage comprises executable code facilitating processing an input trace sequence to render a set of events including the first active message.

20. The computer system of claim 19 wherein the input trace sequence is rendered by a translator of a workload definition.

21. A computer-readable medium having computer executable instructions for performing a set of steps to generate a delay model in a networked system under a defined workload, the steps including:
    generating, for a first active message, a routing structure based upon a network configuration and a source network node and destination network node of the first active message;
    creating a contention structure created by summing together routing structure elements for active message events;
    first calculating, for the first active message, an available bandwidth for use by the message at a path between network nodes utilized by the first active message, the available bandwidth being a function of a level of contention between the first active message and at least a second active message on the path, the level of contention being determined in accordance with the contention structure and the routing structure for the first active message; and
    second calculating, for the first active message, based upon the available bandwidth, a modeled communication delay to communicate at least a portion of the first active message.

22. The computer-readable medium of claim 21 further comprising computer executable instructions for performing the steps of:
    rendering a set of delay values corresponding to a set of active events; and
    identifying an event horizon corresponding to a simulated time duration before an event state change.

23. The computer-readable medium of claim 22 further comprising computer executable instructions for performing the steps of:
    advancing a simulation clock based upon the event horizon; and
    third calculating completed portions of each one of the set of active events based upon the event horizon.

24. The computer-readable medium of claim 23 further comprising computer executable instructions for performing the steps of:
    fourth calculating an updated contention structure in accordance with the message event state change and a present set of active message events after the advancing step;
    rendering a new set of delay values corresponding to the present set of active events in accordance with the updated contention structure and remaining portions of the present set of active events; and
    determining a next event horizon in accordance with the new set of delay values.

25. The computer-readable medium of claim 22 wherein the event state change corresponds to a completed active event, and further comprising executable instructions for performing the step of recording within an output trace record an entry corresponding to the completed active event.

26. The computer-readable medium of claim 21 wherein the routing structure comprises an array.

27. The computer-readable medium of claim 21 wherein the contention structure comprises an array.

28. The computer-readable medium of claim 21 further comprising executable instructions for performing the step of generating a statistical summary of completed events based upon simulated time durations.

29. The computer-readable medium of claim 21 further comprising computer executable instructions for performing the step of processing an input trace sequence to render a set of events including the first active message.

30. The computer-readable medium of claim 29 wherein the input trace sequence is rendered by a translator of a workload definition.

31. A computer system including executable program code for generating a delay model in a networked system under a defined workload, the computer system comprising:
    an input stage that receives a workload description and renders event sequences corresponding to the workload description; and
    an evaluation stage that receives the event sequences and renders timing information representing execution of the event sequences in a distributed processing network configuration, the evaluation stage comprising:
        a routing structure generator for generating, for a first active message, a routing structure based upon a network configuration and a source network node and destination network node of the first active message;
        a contention structure generator for creating a contention structure by summing together routing structure elements for active message events;
        a bandwidth availability calculator for first calculating, for the first active message, an available bandwidth for use by the message at a path between network nodes utilized by the first active message, the available bandwidth being a function of a level of contention between the first active message and at least a second active message on the path, the level of contention being determined in accordance with the contention structure and the routing structure for the first active message; and
        a delay calculator for second calculating, for the first active message, based upon the available bandwidth, a modeled communication delay to communicate at least a portion of the first active message.

* * * * *